(12) United States Patent
Knüpfer et al.

(10) Patent No.: US 7,360,036 B2
(45) Date of Patent: Apr. 15, 2008

(54) DATA MEMORY CIRCUIT

(75) Inventors: Bernhard Knüpfer, Otterfing (DE);
Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 325 days.

(21) Appl. No.: 10/817,504

(22) Filed: Apr. 2, 2004

(65) Prior Publication Data
US 2004/0233759 A1    Nov. 25, 2004

(30) Foreign Application Priority Data
Apr. 4, 2003    (DE) .............................. 103 15 528

(51) Int. Cl.
G06F 12/14 (2006.01)
G06F 13/28 (2006.01)
G06F 7/00 (2006.01)
G06F 5/12 (2006.01)

(52) U.S. Cl. .................. 711/154; 711/167; 365/222; 710/5

(58) Field of Classification Search ............... None
See application file for complete search history.

(56) References Cited

U.S. PATENT DOCUMENTS

| 6,377,509 | B2 | 4/2002 | Yagishita |
| 6,385,691 | B2 | 5/2002 | Mullarkey et al. |
| 6,404,689 | B1 * | 6/2002 | Kirihata et al. ............. 365/222 |
| 6,898,683 | B2 * | 5/2005 | Nakamura .................. 711/167 |
| 2002/0145930 | A1 * | 10/2002 | Bando ....................... 365/222 |

OTHER PUBLICATIONS

German Examination Report dated Jan. 29, 2004.

* cited by examiner

*Primary Examiner*—Gary Portka
*Assistant Examiner*—Duc T. Doan
(74) *Attorney, Agent, or Firm*—Patterson & Sheridan, L.L.P.

(57) ABSTRACT

A data memory circuit is provided. In one embodiment, the data memory circuit comprises a plurality of addressable memory cells, a command decoding device for decoding external commands and a control device for controlling or initiating operations for the operation of the data memory circuit in each case in a manner dependent on the decoded commands. The memory circuit has critical operating states in which the execution of specific commands is impermissible resulting in the course of specific operations in the data memory circuit, wherein a command buffer device buffer-stores commands received during the duration of their impermissibility and releases them for execution after the end of their impermissibility.

22 Claims, 3 Drawing Sheets

DATA MEMORY CIRCUIT

CROSS-REFERENCE TO RELATED APPLICATIONS

This application claims foreign priority benefits under 35 U.S.C. §119 to co-pending German patent application number 103 15 528.7-55, filed Apr. 4, 2003. This related patent application is herein incorporated by reference in its entirety.

BACKGROUND OF THE INVENTION

1. Field of the Invention

The invention relates to a data memory circuit having a multiplicity of addressable memory cells, a command decoding device for decoding external commands and a control device for controlling or initiating operations for the operation of the memory circuit in each case in a manner dependent on the decoded commands. One area of application of the invention is that of DRAMs (Dynamic Random Access Memories), i.e., dynamic read-write memories with the possibility of direct access to the memory cells.

2. Description of the Related Art

The operation of a data memory circuit includes, above all, the writing in and reading-out of data at selectively addressed memory cells. A write or read access consists, in principle, producing a data connection between the respectively addressed memory cells and the data terminals of the memory circuit, which usually comprises closing selected electronic switches in a network of control and data lines which covers the entire array of memory cells. Each write or read process comprises a sequence of individual operations, and in most conventional memory circuits the relevant operation commands are applied by an external controller. The controller generally "knows" the specification of the memory circuit and thus "knows" from the outset how long the execution of an operation command lasts and accordingly how long to wait before being permitted to send a new command which ends the previously commanded operation.

It can happen, however, that the controller is not exactly coordinated with the specification of the memory circuit and sends a new command early. In this case, the new command must not be obeyed, at least not when the newly commanded operation depends on the successful execution of the previous operation.

Furthermore, in many memory circuits there are certain operating sequences which are initiated by the controller by means of a command and then proceed as an internal self-controlled process, e.g., under the influence of an internal clock signal, without synchronization with the controller. This may involve processes which, although permitted to be interrupted by a new command, must not be interrupted during specific critical phases while proceeding. Since the controller does not know or cannot know when precisely the aforesaid critical phases exist, it is possible for a new command to coincide temporally with such a phase. In this case, too, the new command must not be obeyed. One example of such self-controlled processes is the "self-controlled refresh" of data (self-timed refresh) in DRAMs.

In the case of DRAMs, the memory cells are arranged within individual arrays or segments in each case in matrix form in rows and columns. Each row is assigned a control line referred to as a "word line", and each column is assigned a so-called "bit line", which usually has two cores and leads to an amplifier assigned to the relevant column. These amplifiers are referred to as "sense amplifiers", although they amplify not only data to be read out but also data to be written in. Access to a cell is begun by activation of the relevant word line in accordance with a row address, as a result of which switches are closed (i.e., turned on) at all cells of the assigned row in order to connect said cells to the sense amplifiers via the bit lines. During this operation, the charge of the cells is discharged onto the bit lines, which until then have been connected to a common "precharge potential". On account of the discharging of the cell charge, the potential of one bit-line core increases or decreases in each case with respect to the other bit line core which remains at the precharge potential. The sense amplifiers detect the respective potential differences of the bit line pairs and amplify these differences, so that the bit line core having the lower potential is brought to the "low" (ground) potential "L" and the bit line core having the higher potential is brought to the "high" supply potential "H" of the memory cell array. As a result of this, the information sensed at the cells is written back in amplified fashion to the cells and thus refreshed.

In the actual reading or writing mode, after the activation operation described above, the sense amplifiers are selectively connected to the data terminals of the DRAM under control through column address information. In the event of reading, the data latched in the sense amplifiers are taken at the data terminals; for the purpose of writing, the data latched in the sense amplifiers are overwritten by the new data input at the data terminals and are thus transferred into the memory cells via the bit lines.

Since the cells lose their charge and thus the information stored in them in each case after a relatively short time, they have to be periodically refreshed between the read or write accesses. For this purpose, all the word lines of the DRAM have to be activated successively at suitable time intervals in order to cause the sensed cell information to be written back in amplified fashion as described above. After the cell information has been refreshed in this way, the relevant word line is brought to the non-active normal state again, as a result of which the bit line cores are electrically insulated from the memory cells. If this has been done, then both bit line cores are brought to the common precharge potential again ("precharge" state). The entire operation of word line activation and bit line amplification by the sense amplifier takes up a certain minimum time described by the specification parameter tRAS. If this time is shortened, for instance by virtue of the internal "precharge" of the bit lines being executed too early, then the full charge state of the cells cannot be reestablished. In the extreme case, the cell information may in this way even be attenuated instead of refreshed. In order to preclude this risk, a tRAS timer is activated during the word line activation, which timer instigates the execution of the precharge only when the full charge state of the cells is established. This waiting time thus signifies a critical operating state of the DRAM during which specific external commands are to be regarded as impermissible because it would be impermissible to execute them at this time.

During regular useful operation of the DRAM, the external controller coordinates the refresh cycles with the write and read cycles, for instance, by sending an "auto refresh" command between writing and reading operations, in order to activate an internal refresh counter which is synchronized with the controller by means of the common system clock and controls the cyclic activation of the word lines for the refresh. On account of this synchronization and with knowledge of the specification of the DRAM, the controller can avoid the situation in which its next command (e.g., the external activation command upon resumption of a write or read cycle) falls within the running time of the tRAS timer.

The situation is different, however, in the case of the self-timed refresh. This operation is carried out during relatively long quiescent times of the DRAM. For this purpose, the cell information refresh controlled by the DRAM is initiated once by an external command of the controller, usually by zeroing its output signal CKE ("clock enable") with simultaneous issuing of the auto refresh command. The DRAM remains in this state as long as the external signal CKE retains the logic value 0. During this time, a self-refresh timing device runs in the DRAM under the influence of an internal oscillator and controls the sequential activation of the word lines without external action. This sequence remains hidden to the controller. If CKE is brought to a logic 1 by the controller, the DRAM leaves the self-timed refresh state. However, if there is a word line refresh underway at this time, the precharge is delayed by the tRAS timer until the complete refresh of the corresponding memory cells is ensured. If, during this time, the controller directs one of the impermissible commands to the DRAM (e.g., activation of another word line), then the execution of this command is blocked in the DRAM, and the command is rejected. This command refusal is effected on the basis of a status indication indicating that the time determined by the tRAS timer has not yet elapsed.

The above-described self-timed refresh in a DRAM is only an illustrative example of processes or operations which are intended to proceed in a data memory and are not permitted to be terminated or disturbed at any time by any arbitrary external command. It depends on the respective type of data memory as to what processes of this type are taken into consideration for this and what external commands are respectively impermissible. In any event, however, the rejection of external commands at a data memory circuit may lead to serious disturbances in the entire system in which the memory circuit is situated.

SUMMARY OF THE INVENTION

The object of the invention is to design a data memory circuit in such a way as to avoid situations in which external commands have to be rejected.

Accordingly, one embodiment of the invention is realized by a data memory circuit having a multiplicity of addressable memory cells, a command decoding device for decoding external commands and a control device for controlling or initiating operations for the operation of the data memory circuit in each case in a manner dependent on the decoded commands. Critical operating states in which the execution of specific commands is impermissible result in the course of specific operations in the data memory circuit. A command buffer device, which buffer-stores commands received during the duration of their impermissibility and releases them for execution after the end of their impermissibility, may be provided.

By virtue of the command buffer device that is present according to one embodiment of the invention, the data memory circuit can execute any external command even if the command is impermissible at the point in time when it is received because execution of the command at this point in time is incompatible with a currently prevailing operating state.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
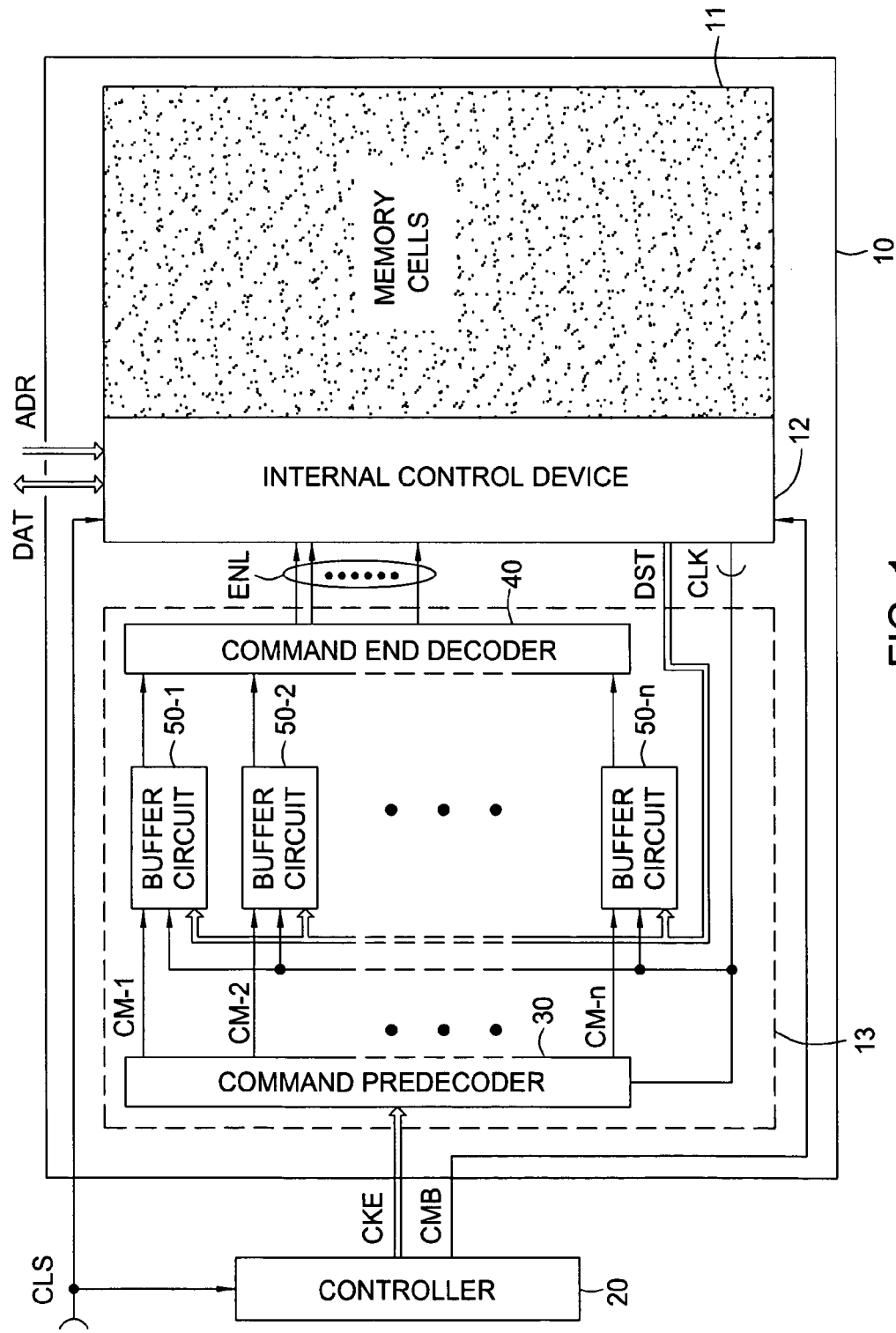
FIG. 1 is a schematic diagram illustrating a data memory circuit with an external controller according to one embodiment of the invention.

The data memory circuit 10 illustrated schematically in FIG. 1 is a "synchronous" DRAM (SDRAM), the constituent parts of which are all integrated on a chip, as indicated by the bold rectangular contour line. The quantity of memory cells, which may be distributed between a plurality of banks with in each case a plurality of segments, is illustrated schematically by the shaded block 11. An internal control device 12 and a command decoder block 13 (dashed contour line) are illustrated as further blocks on the chip.

Situated at the chip of the DRAM 10 are a plurality of external terminals, of which the following are shown: a data terminal DAT for inputting and outputting memory data bits in parallel form; an address terminal ADR for applying address bits in parallel form; a command terminal for applying m parallel command bits CMB; a terminal for applying a system clock signal CLS; a terminal for applying the clock activation signal CKE.

The control device 12 controls the operations of the DRAM 10 depending on the m command bits CMB, which are usually supplied by an external controller 20 (memory chip controller MCC). For this purpose, the command bits CMB are decoded in the command decoder block 13, in such a way that each command excites a specific combination of enable lines ENL in order to condition specific elements in the control device 12 for the execution of the relevant command. Thus, by way of example, the command "ACTIVATE" leads to the excitation of those enable lines ENL which condition the elements, inter alia, for calling up the row address at an address buffer, for canceling the precharge of the bit lines and for switching the word line of the addressed row to H-potential. A subsequent command "READ" excites the enable lines ENL which condition the elements for maintaining H potential on the word line, for calling up the column address and for connecting the sense amplifiers selected in accordance with the column address to the data terminals DAT. The individual steps within such (and other) commanded operations are temporally controlled by an internal clock signal CLK, which is switched on and synchronized with the system clock signal CLS as long as the signal CKE from the controller has the logic value "1".

The command decoder block 13 usually carries out the decoding of the commands sent by the controller 20 in two stages. In accordance with the illustration in FIG. 1, a command predecoder 30 receives the m command bits CMB, and for each of n different bit combinations, the command predecoder 30 provides precisely one assigned specimen of n command lines CM-1 to CM-n temporarily to an activated state, precisely for the duration of a half-cycle of the clock signal CLK. If m is the bit width of the command bits, then at most $n=2^m$ different commands are possible, and each command "i" is indicated by excitation of the assigned command line CM-i (where i=1, 2, ... n). A command end decoder 40 has n inputs to which the states of the n command lines CM-1:n can be transferred (the ":" herein denotes the word "to").

In the case of the prior art, the states of all n command lines are always transferred directly to the n inputs of the end decoder 40. Consequently, each command directly brings about the activation of an individually assigned input of the end decoder 40, which thereupon excites all those enable lines ENL which lead to the control elements for the execution of the relevant command. If, at this point in time, an operation in the DRAM is running through a critical stage which does not tolerate the execution of the command, in the case of the prior art a blockade signal ensures that the relevant control elements do not respond to the excitation of the assigned enable lines. The command is thus ignored and rejected.

According to one embodiment of the invention, the DRAM 10, as shown in FIG. 1, includes respective buffer circuits 50-i inserted between each command line CM-i and the assigned input of the command end decoder 40. Each buffer circuit 50-i receives, in addition to the signal of the assigned command line CM-i, the clock signal CLK and a status indication DST, which are derived from the control device 12. The status indication DST provides information on whether there currently exists in the DRAM a critical operating state with which the execution of a new command might conflict. The status indication DST may be provided by activation of specific indication lines in a line bundle, whereby the type of critical operating state involved is also indicated.

In each buffer circuit 50-i, the status indication DST is logically combined with the state ("activated" or "non-activated") of the assigned command line CM-i to ascertain whether a command indicated by activation of said command line is compatible with the operation state of the DRAM indicated by DST. If not (i.e., if a conflict may occur), the command is interpreted as an "impermissible command", and this status is stored in the buffer circuit, for example, by the setting of a flip-flop. As soon as DST indicates that the DRAM is in an operating state which is compatible with the execution of the previously impermissible command, the state of the flip-flop is interrogated and transferred as activation pulse to the assigned end decoder input. Thus, in contrast to the prior art, cases of conflict are not resolved by rejecting a currently impermissible command, but rather by buffering the command forwarding.

Figure 2:
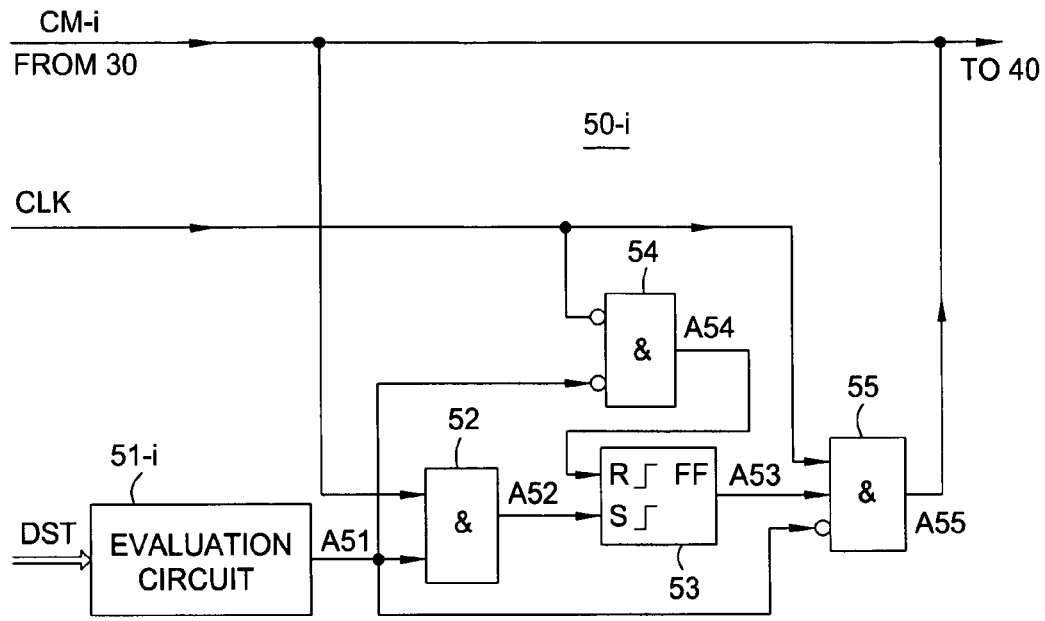
FIG. 2 is a circuit diagram illustrating further details of an exemplary embodiment of a buffer circuit in the data memory circuit according to one embodiment of the invention.

An example of the circuitry realization of a suitable buffer circuit 50-i is shown in FIG. 2. The buffer circuit 50-i contains various logic circuits which receive, process and output binary signals having the logic values (binary states) "0" and "1". The following shall be assumed for the buffer circuit shown: the clock signal CLK changes between the two logic values "0" and "1" from half-cycle to half-cycle. If the predecoder 30 (FIG. 1) decodes the appearance of the command i, the assigned command line CM-i goes to an "activated" state corresponding to the logic value "1", for the duration of a "1" half-cycle of the clock signal CLK; otherwise, the command line is at the logic value "0".

The buffer circuit 50-i contains an evaluation circuit 51-i, which receives and analyzes the DRAM status indication DST. From the bits of the DRAM status indication DST, the evaluation circuit 51-i identifies all those states of the DRAM 10 which are not compatible with execution of the command i. For the duration of the existence of such an incompatible state, the output signal A51 of the evaluation circuit 51-i is at "1" and forms a buffer standby signal; otherwise, A51 is at "0". The state of the signal A51 is combined with the state of the command line CM-i in an AND gate 52. Only if, during the identification of a state that is incompatible with the command i (A51="1"), the command line CM-i becomes "1", i.e., the command i appears as an impermissible command, does the output signal A52 of the AND gate 52 temporarily go to "1". The "positive" leading edge of this "1" pulse sets an edge-triggered RS flip-flop 53, so that the output signal A53 thereof goes to "1" and is held in this state for the time being.

The "1" state of the signal A53 thus retains the information that a command i has been received during a time of impermissibility, i.e., during a "critical" DRAM state that is incompatible with this command. This command is intended to be forwarded as a "1" pulse to the end decoder 40 as soon as the critical DRAM state is ended. For this purpose, a further AND gate 55 may be utilized, which is fed, in addition to the signal A53, the inverted version of the signal A51 and the clock signal CLK and whose output is connected to the command line CM-i. As long as the critical DRAM state exists, A51 keeps the AND gate 55 inhibited. If the critical DRAM state is at an end and A51 has thus gone to "0", the AND gate switches through for the duration of the subsequent "1" half-cycle of the clock signal CLK and thus passes the desired "1" pulse to the end decoder 40 in order to allow the command i to be executed. This pulse thus begins with the positive edge of the clock signal CLK and ends with the negative edge thereof.

Afterward, the flip-flop 53 has to be reset again immediately to prevent the "1" pulse from being repeated at the output A55 by the subsequent "1" half-cycles of the clock signal CLK. This is done by a third AND gate 54, which receives the inverted version of the signal A51 and the inverted version of the clock signal CLK and whose output is connected to the reset input R of the flip-flop 53. If and as long as no critical DRAM state prevails, the AND gate allows the inverted clock signal to pass through, so that the flip-flop is reset with each negative edge of the clock signal CLK. The flip-flop thus remains reset outside the DRAM operating state that is critical for a command i, and can be set only during a critical DRAM state because the reset edges fail to appear at the R input in this time.

In the embodiment of a buffer circuit 50-i as shown in FIG. 2, a decoded command i is also transferred during a time of impermissibility to the end decoder via the command line CM-i. This does no harm, however, if the control device 12 of the DRAM 10 is provided, in the customary manner, with the known means which block the execution of a command in the case of conflict. However, these blockade means can be at least partly obviated and replaced simply by inserting a switch into the command line CM-i of the buffer circuit 50-i, as shown in FIG. 3.

Figure 3:
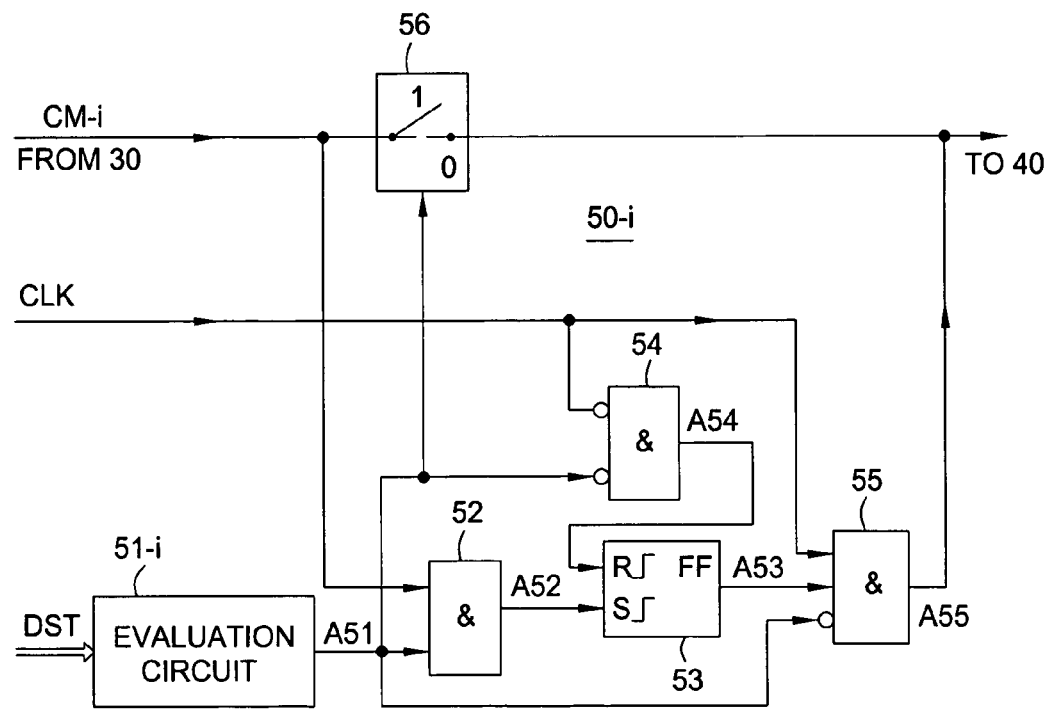
FIG. 3 is a circuit diagram illustrating a buffer circuit according to another embodiment of the invention.

In accordance with the embodiment shown in FIG. 3, a switch 56 is inserted in the path of the command line CM-i between the point where the branch to the AND gate 52 is situated and the point where the output A55 of the AND gate 55 is connected, which switch responds to the output signal A51 of the evaluation circuit 51-*i*. Normally, if no DRAM state that is critical for the command is present and the signal A51 thus has the logic value "0", the switch 56 is in a closed position depicted in dashed fashion, so that a command i is conducted through to the end decoder 40 (FIG. 1). As shown, as long as the critical DRAM state is identified and the signal A51 is accordingly at "1", the switch 56 is opened, so that a command i that is decoded during the critical state does not reach the end decoder 40 and, consequently, is not executed. Otherwise, the circuit according to FIG. 3 operates in the same way as described above with reference to FIG. 2. In other words, the retained command i is fetched immediately after the end of the critical DRAM state.

In one embodiment, all the buffer circuits 50-1:n shown in FIG. 1 are designed to be identical to one another, with the exception of the respective evaluation circuit 51-*i*, which is specifically adapted to the respective command i. In other words, each evaluation circuit 51-*i* is programmed in such a way to reply to the status indication DST with a "1" only when an indicated DRAM state specifically does not tolerate the assigned command. The status indication DST may contain, e.g., for all DRAM states which could actually clash in a highly conflictual manner with some command, a specially assigned DST indication line which is activated only when the relevant state is present. In this case, in each evaluation circuit 50-*i*, a simple OR operation of precisely those "critical" DST indication lines which are assigned to the DRAM states that are incompatible with the relevant command i may be performed.

Figure 4:
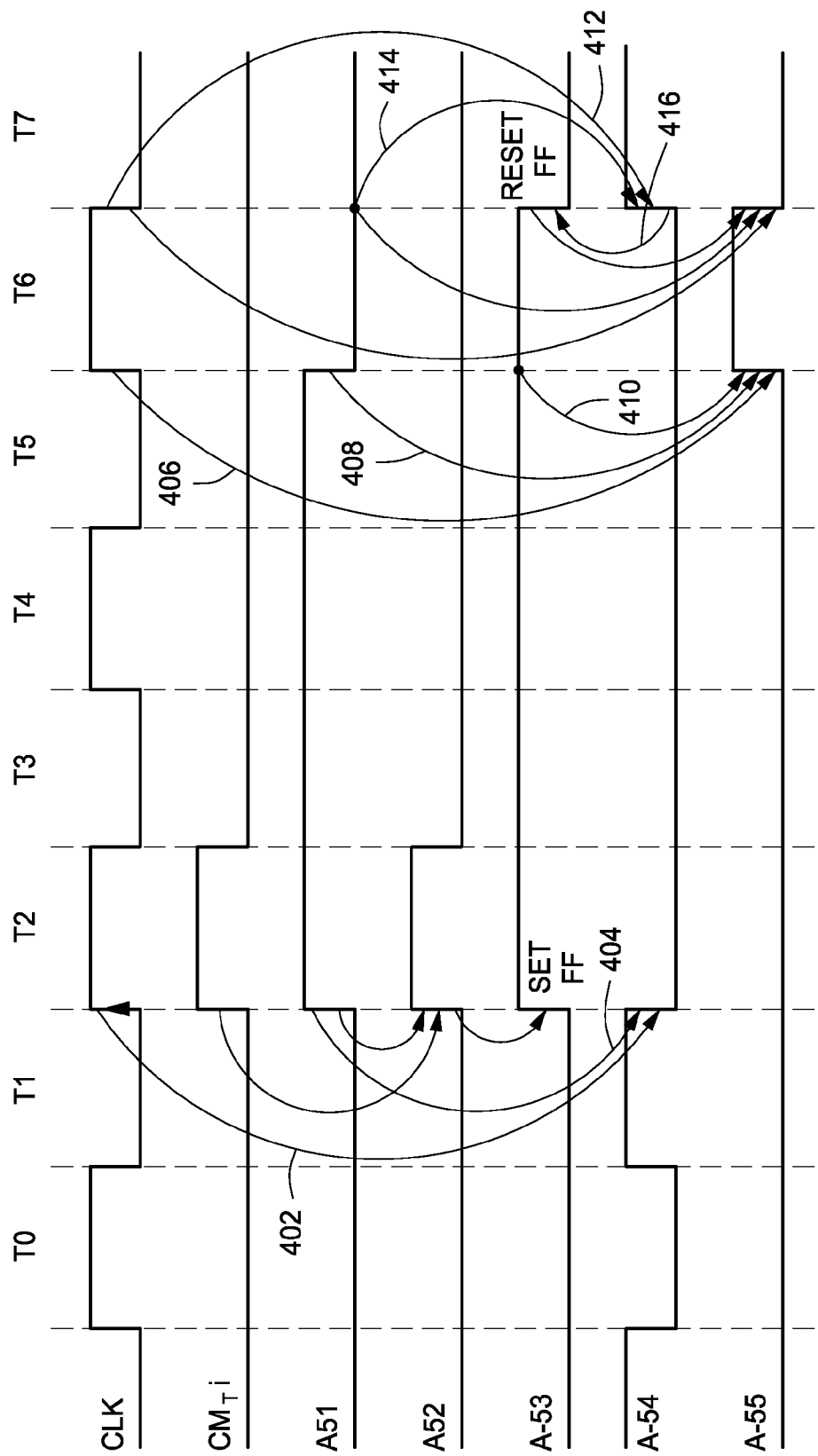
FIG. 4 is a timing diagram illustrating the operation of a buffer circuit according to an embodiment of the invention.

A timing diagram illustrating the relationship between the signals of the above-described buffer circuits is illustrated in FIG. 4. For example, the assertion of the pulse by the further AND gate 55, via its output A55, is illustrated at time T6. As stated above, the further AND gate 55 is fed signal A53, the inverted version of the signal A51 and the clock signal CLK. Accordingly, when A53 and the CLK are a "1", and A51 is a "0", the further AND gate 55 outputs a "1", thus asserting the pulse. This is illustrated by arrows 406, 408 and 410, respectively.

Another timing relationship illustrated in FIG. 4 is the resetting of the edge-triggered RS flip-flop 53. This is illustrated at time T7. As stated above, the edge-triggered RS flip-flop 53 is reset when the output signal A54 of the third AND gate 54 is a "1". This is shown by arrow 416. In order for the third AND gate 54 to output a "1", both the inverted version of the clock signal CLK and the inverted version of the signal A51, must be "0". This is illustrated by arrows 412 and 414, respectively. In contrast, if either the CLK or A51 is a "1", the third AND gate 54 will output a "0". This is illustrated by arrows 402 and 404 at time T2, where, the CLK and A51 are both "1".

As mentioned in the introduction, one of the critical operating states in a DRAM is the tRAS time that is to be complied with between the activation of a word line and the precharge. During this time, which is indicated by the running of the tRAS counter, no new word line activation and also no precharge are permitted to be effected. Consequently, all buffer circuits assigned to commands whose execution would result in a word line activation and/or a precharge should respond to the tRAS indication in order to forward or repeat the relevant command only after the tRAS time has elapsed. This concerns, inter alia, the ACTIVATE command, the command for a column access for read or write operation (READ, WRITE), furthermore the auto refresh command and practically any command which can be directed to the DRAM after the reawakening of the externally controlled memory operation from a self-timed refresh. It also concerns possible external "precharge" commands in the case of a DRAM whose bit line precharge is not effected automatically (as in the case of the so-called autoprecharge).

Another critical operating state of a DRAM for specific commands may be the running of the tWR counter, which prevents a premature precharge after the execution of a write command has started. Consequently, all buffer circuits assigned to commands whose execution would result in a word line activation and/or a precharge should also respond to the tWR indication in order to forward or repeat the relevant command only after the tWR time has elapsed.

The abovementioned critical operating states and the commands mentioned as impermissible for these operation states are only examples, of course. What commands must or are intended to be deemed to be impermissible in each case, and during what operating states, depends on the respective type of data memory circuit and its command structure. If it is ensured that the command-issuing external controller always takes account of the specifications of the data memory circuit, it is unlikely that, in the case of externally controlled operating sequences, a command will be sent at an impermissible time. In such cases, it may suffice to restrict the command buffer according to the invention to situations in which an external command encounters a critical stage of an internally controlled process such as, e.g., of the self-timed refresh. This restriction also lies within the scope of the invention and may be effected, e.g., by providing buffer circuits only for those commands which could be used for the termination of internally controlled processes. This makes it possible to minimize the circuitry outlay for the command buffer device. As an alternative or in addition, it is possible to ensure that the command buffer device can start to function only when an external command appears during critical phases of an internally controlled process.

The two-stage structure of the command decoding device 30 as illustrated in the drawings and also the illustrated buffer circuits themselves are only exemplary embodiments for one possible circuitry realization of the invention. Numerous modifications of the circuits shown and also other alternative circuits are possible, of course, to realize the command-buffering concepts according to the invention.

While the foregoing is directed to embodiments of the present invention, other and further embodiments of the invention may be devised without departing from the basic scope thereof, and the scope thereof is determined by the claims that follow.

What is claimed is:

1. A data memory circuit, comprising:
  a plurality of addressable memory cells;
  a command-decoding device configured for decoding external commands received from a source external to the data memory circuit;
  a control device configured for controlling and initiating operations on the memory cells in response to the decoded external commands; and
  a command buffer device configured for buffer-storing an external command received in a critical operating state period during which execution of the external command is impermissible and for releasing the buffer-stored external command for execution after end of the critical operating state period, wherein the command buffer device receives from the control device a multi-bit status signal which indicates the critical operating state period and a critical operating state selected from one of a plurality of critical operating states, wherein the selected critical operating state is determined by activation of multiple bits of the multi-bit status signal.

2. The data memory circuit of claim 1, wherein:
a plurality of critical operating states are possible, and in one or more critical operating states, a set of commands is impermissible; and
the command buffer device includes a buffer circuit assigned to each individual command of the decoded external commands.

3. The data memory circuit of claim 2, wherein each buffer circuit comprises:
a state evaluation circuit, responsive to the multi-bit status signal, for generating a buffer standby signal during at least one operating state that is critical for the execution of respective impermissible command; and
a logic circuit for setting a bi-stable element into a first state when the assigned command appears while the buffer standby signal is active and for re-generating the assigned command after the buffer standby signal has ended.

4. The data memory circuit of claim 3, wherein the command decoding device comprises:
a predecoder, which, for each received command, activates a command line assigned to the received command; and
an end decoder which excites selected enable lines of the control device depending on which of the command lines is activated; and wherein each buffer circuit is connected to a respectively assigned command line between the predecoder and the end decoder to receive the command from the respective command line and to apply a re-generated command to the respective command line.

5. The data memory circuit of claim 4, wherein each buffer circuit includes a switch in a path of the respective command line, wherein the switch is opened precisely while a buffer standby signal is active to inhibit forwarding of an activation of the command line effected by the predecoder to the end decoder.

6. The data memory circuit of claim 5, wherein the source of external commands is adapted to a specification of the data memory circuit with regard to command-issuing times, and wherein the command buffer device handles external commands whose execution leads to termination of internally controlled processes in the data memory circuit.

7. The data memory circuit of claim 6, wherein the command buffer device handles external commands whose execution leads to termination of a self-controlled data-refresh process in the memory circuit.

8. The data memory circuit of claim 1, wherein the control device includes blockage elements for blocking execution of commands during the critical operating state period, and wherein the command buffer device directly forwards commands received during the critical operating state period.

9. The data memory circuit of claim 1, wherein the command buffer device inhibits forwarding of the received command to the control device during the critical operating state period.

10. A data memory circuit, comprising:
a plurality of addressable memory cells;
a command decoder configured for receiving external commands from a source external to the data memory circuit, the command decoder having a plurality of command-buffer circuits for buffer-storing external commands received during critical operation state periods when execution of the commands is impermissible and for releasing the buffer-stored external commands for execution after the critical operation state periods, wherein each command-buffer circuit receives a multi-bit status signal which indicates the critical operating state period and a critical operating state selected from one of a plurality of critical operating states, wherein the selected critical operating state is determined by activation of multiple bits of the multi-bit status signal; and
an internal controller configured for controlling operations on the memory cells in response to external commands from the command decoder.

11. The data memory circuit of claim 10, wherein the command decoder further comprises:
a predecoder;
an end decoder; and
a plurality of command lines connecting the plurality of command-buffer circuits between the predecoder and the end decoder, wherein the predecoder assigns and activates one or more command lines in response to the received commands and the end decoder excites one or more enable lines of the internal controller corresponding to the activated command lines.

12. The data memory circuit of claim 11, wherein each command-buffer circuit comprises:
a state evaluation circuit configured for generating a buffer standby signal during the critical operation state periods; and
a logic circuit configured for holding an assigned command while the buffer standby signal is active and for forwarding the assigned command to the end decoder after the buffer standby signal has ended.

13. The data memory circuit of claim 12, wherein each command-buffer circuit further comprises a switch disposed in-line with the respective command line connecting the predecoder and the end decoder, wherein the switch is connected to the state evaluation circuit and opens when the buffer standby signal is active.

14. The data memory circuit of claim 12, wherein the internal controller includes a command-blocking circuit for blocking execution of commands during the critical operation state periods.

15. The data memory circuit of claim 12, wherein the command buffer circuits handle external commands whose execution leads to termination of internally controlled processes in the data memory circuit.

16. The data memory circuit of claim 12, wherein the command buffer circuits handle external commands whose execution leads to termination of a self-controlled data-refresh process in the memory circuit.

17. A data memory circuit, comprising:
a plurality of addressable memory cells;
a decoder means for receiving and decoding commands, the decoder means having a plurality of command-buffer means for buffer-storing commands received during critical operation state periods when execution of the commands is impermissible and for releasing the buffer-stored commands for execution after respective critical operation state periods, wherein each command-buffer means receives a multi-bit status signal which indicates the critical operating state periods and a critical operating state selected from one of a plurality of critical operating states, wherein the selected critical operating state is determined by activation of multiple bits of the multi-bit status signal; and
a controller means for controlling operations on the memory cells in response to commands from the decoder means and for providing the multi-bit status signal to the command-buffer means.

18. The data memory circuit of claim 17, wherein the decoder means further comprises a plurality of command lines connecting the plurality of command-buffer means between a predecoder means for assigning and activating one or more command lines in response to the received commands and an end decoder means for activating one or more enable lines of the controller means corresponding to the activated command lines.

19. The data memory circuit of claim 18, wherein each command-buffer means comprises:
   a state evaluation means for evaluating an operating state of the memory cells and for generating a buffer standby signal during the critical operation state periods; and
   a logic circuit means for holding an assigned command while the buffer standby signal is active and for forwarding the assigned command to the end decoder after the buffer standby signal has ended.

20. The data memory circuit of claim 19, wherein each command-buffer means further comprises a switching means for selectively opening and closing the respective command line, the switching means disposed in-line with the respective command line connecting the predecoder means and the end decoder means, wherein the switching means is connected to the state evaluation circuit and opens when the buffer standby signal is active.

21. A method for controlling the execution of commands in a memory device comprising a plurality of addressable memory cells, the method comprising:
   receiving and analyzing a multi-bit status indication signal which identifies a critical operating state selected from a plurality of critical operating states that is not compatible with the execution of an external command, wherein the multi-bit status indication signal is provided by an internal control device of the memory device to a command decoder of the memory device, wherein the selected critical operating state is determined by activation of multiple bits of the multi-bit status signal;
   receiving the external command while the memory device is performing a critical operation in the selected critical operating state making execution of the external command impermissible;
   buffering the external command until the memory device completes the critical operation; and then
   executing the external command.

22. A data memory circuit, comprising:
   a plurality of addressable memory cells;
   a command-decoding device configured for decoding external commands received from a source external to the data memory circuit;
   a control device configured for controlling and initiating operations on the memory cells in response to the decoded external commands; and
   a command buffer device configured for buffer-storing an external command received in a critical operating state period during which execution of the external command is impermissible and for releasing the buffer-stored external command for execution after end of the critical operating state period, said command-buffer device comprising a state evaluation circuit configured for:
      receiving and analyzing a multi-bit status indication signal from the control device indicative of a critical operating state selected from a plurality of critical operating states which are not compatible with execution of the external command, wherein the selected critical operating state is determined by activation of multiple bits of the multi-bit status signal.

* * * * *